(12) United States Patent
Randhawa et al.

(10) Patent No.: US 9,202,725 B2
(45) Date of Patent: Dec. 1, 2015

(54) HOLDING AND ROTARY DRIVING MECHANISM FOR FLAT OBJECTS

(75) Inventors: Rubinder S. Randhawa, Dublin, CA (US); Shmuel Erez, San Jose, CA (US); Harry Christov, Campbell, CA (US); Basha Sajjad, Pleasanton, CA (US)

(73) Assignee: Planar Semiconductor, Inc., San Jose, CA (US)

( * ) Notice: Subject to any disclaimer, the term of this patent is extended or adjusted under 35 U.S.C. 154(b) by 956 days.

(21) Appl. No.: 11/490,950

(22) Filed: Jul. 24, 2006

(65) Prior Publication Data

US 2008/0017225 A1 Jan. 24, 2008

(51) Int. Cl.
*B65G 47/24* (2006.01)
*H01L 21/67* (2006.01)
*H01L 21/673* (2006.01)

(52) U.S. Cl.
CPC .... *H01L 21/67057* (2013.01); *H01L 21/67313* (2013.01)

(58) Field of Classification Search
CPC .................................................. A47L 15/4208
USPC .................... 134/140, 153, 157, 902
See application file for complete search history.

(56) References Cited

U.S. PATENT DOCUMENTS

| | | | | |
|---|---|---|---|---|
| 5,052,886 A | * | 10/1991 | Moroi | 414/757 |
| 5,357,645 A | * | 10/1994 | Onodera | 15/97.1 |
| 5,860,181 A | * | 1/1999 | Maekawa et al. | 15/102 |
| 6,082,377 A | * | 7/2000 | Frey | 134/6 |
| 6,347,198 B1 | * | 2/2002 | Yamamoto et al. | 399/27 |
| 6,357,996 B2 | * | 3/2002 | Bacchi et al. | 414/754 |
| 6,454,516 B1 | * | 9/2002 | Yamagishi | 414/754 |
| 6,530,157 B1 | * | 3/2003 | Henderson et al. | 33/644 |
| 6,851,152 B2 | * | 2/2005 | Sotozaki et al. | 15/88.3 |
| 6,932,558 B2 | * | 8/2005 | Wu | 414/757 |
| 6,932,884 B2 | * | 8/2005 | Saito et al. | 156/345.17 |
| 2002/0166569 A1 | | 11/2002 | Harvey et al. | |
| 2005/0109373 A1 | | 5/2005 | Brown et al. | |
| 2006/0096048 A1 | | 5/2006 | Mikhaylichenko et al. | |

OTHER PUBLICATIONS

U.S. Appl. No. 11/269,250, filed 2005, R. Randhawa.
The article "A novel approach to metal lift-off for GaAs ICs" (see the Internet address: (http://www.compoundsemiconductor.net/articles/magazine/9/10/3/1) by Mehran Janani.

* cited by examiner

*Primary Examiner* — Michael Barr
*Assistant Examiner* — Jason Riggleman
(74) *Attorney, Agent, or Firm* — Schwegman Lundberg & Woessner, P.A.

(57) ABSTRACT

A substrate holding and rotary driving mechanism, e.g., for a cleaning chamber with vertical orientation of the wafer, that is comprised of a three-armed spider which is rotatingly installed on the outer side of the cleaning chamber and rotatingly supports on the outer ends of its arms outer shafts with eccentrically arranged inner shafts. The inner shafts pass through the outer shafts into the cleaning chamber where they support contact rollers, while the opposite ends of the inner shafts support gears driven into rotation by a synchronous belt. The contact rollers can be moved apart for insertion or removal of wafers from and into the chamber. This is achieved by turning the spider with eccentric inner shafts in one or another direction.

18 Claims, 3 Drawing Sheets

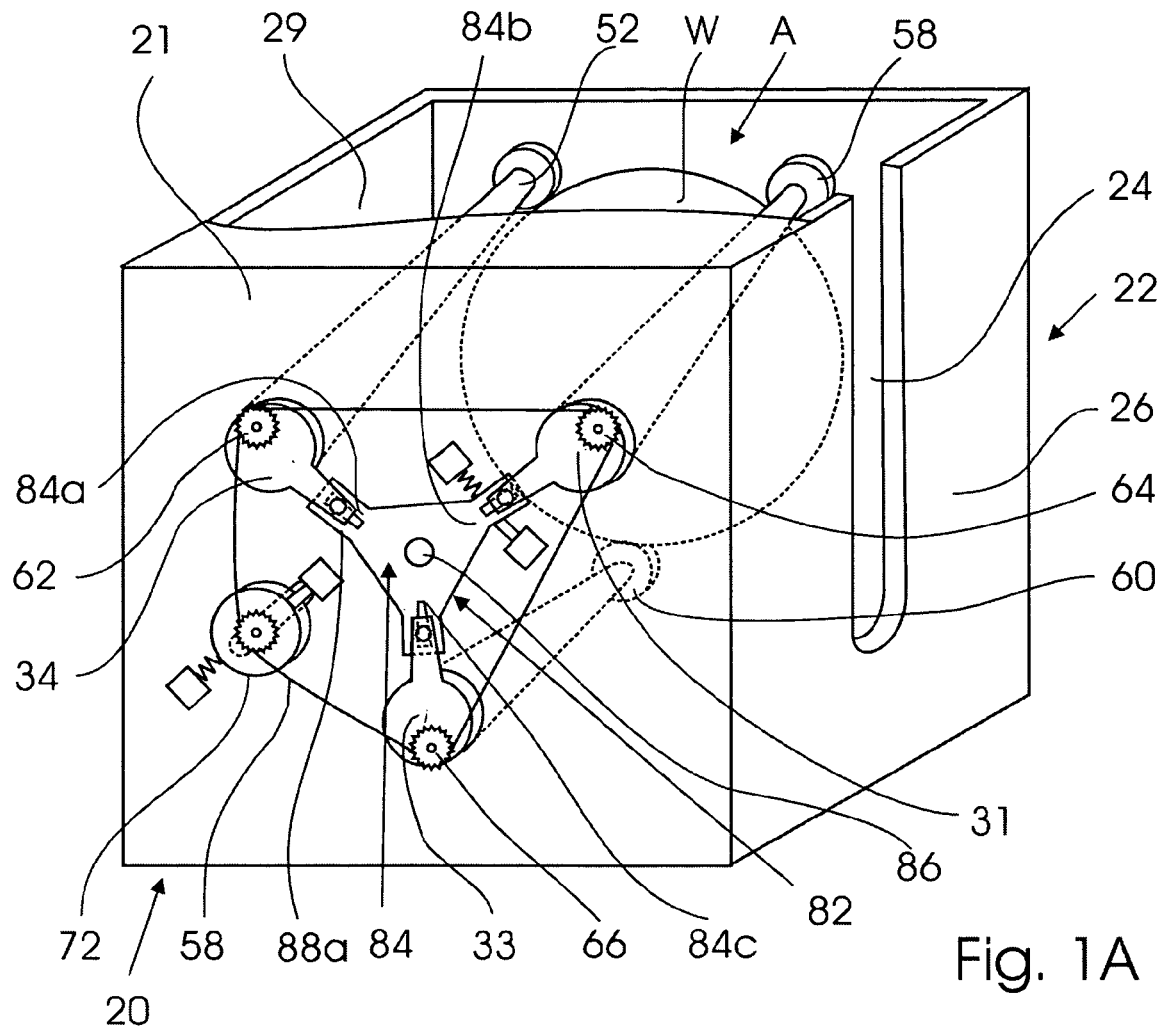
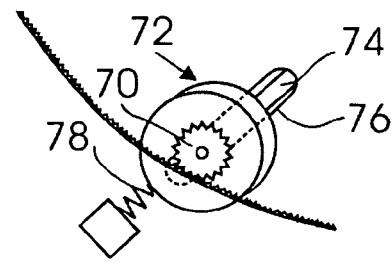
Fig. 1A
Fig. 1B

HOLDING AND ROTARY DRIVING MECHANISM FOR FLAT OBJECTS

CROSS-REFERENCES TO RELATED APPLICATIONS

The present patent application is related to U.S. patent application Ser. No. 11/269,250 filed by the same applicant on Nov. 9, 2005 and entitled "APPARATUS AND METHOD FOR CLEANING FLAT OBJECTS IN A VERTICAL ORIENTATION WITH PULSED LIQUID JET" on which the present application is based.

FIELD OF THE INVENTION

The present invention relates to the field of cleaning flat objects, in particular to a mechanism used for holding and driving semiconductor substrates, wafers, or the like, arranged vertically, e.g., in wet cleaning chambers.

DESCRIPTION OF THE PRIOR ART

Cleaning of surfaces of wafer substrates is one of the most important steps in the fabrication of semiconductor microelectronic devices. It is well known that the presence of chemical contaminants and particles of impurities may significantly reduce the yield of products and noticeably affect performance and reliability of the produced semiconductor devices.

In view of the present trend in the semiconductor industry that goes far beyond features such as submicron sizes, the effective techniques for cleaning silicon wafers, e.g., initially and after oxidation and patterning, are now more important than ever before because of the extreme sensitivity of semiconductor surfaces to the presence of contaminants. Specifically, total metallic impurities should be far less than $10^{10}$ atoms per $cm^2$. The presence of particles larger than 0.1 µm in size should be much less than approximately 0.1 per $cm^2$.

Because the above criteria are very stringent, the efficiency of the equipment and processes used for wafer cleaning should be evaluated from the point of view of satisfaction of the above requirements in the treated wafers. In other words, the apparatus and mechanisms that are used for driving and moving, e.g., semiconductor wafers, between the working stations, or for rotation in cleaning chambers, should not be source of contamination. Therefore, contacts of the actuating members, such as contact rollers, drives, end effectors, etc., with the treated objects must be minimized.

There exists a plurality of various methods and processes for wafer cleaning that roughly can be subdivided into dry-physical, wet-physical, combined wet physical/chemical, vapor-phase methods, etc. Furthermore, there exists a series of apparatuses for implementing the aforementioned cleaning processes in the industry.

In a majority of cases, the cleaning processes are oriented specifically on silicon since this material is the basis for fabrication of integrated circuits.

The present invention pertains to the aforementioned wet-physical and combined wet physical/chemical processes, which are the most widely used processes for the cleaning of semiconductor wafers. Wet cleaning methods and apparatuses, in turn, have a plurality of different implementations with vertical or horizontal orientation of single or multiple wafers performing different specific movements during the cleaning cycle, the use of different cleaning media and tools, the use of different methods for drying, etc.

Attempts have been made to apply a new approach to the wafer-cleaning problem. An example of such an approach is the development of a rapid-pulse harmonic spray technology developed by the applicant and described by Mehran Janani, et al., in the article "A novel approach to metal lift-off for GaAs ICs" (see the Internet address: (http://www.compound-semiconductor.net/articles/magazine/9/10/3/1).

The fluid droplets in each pulse interact with the wafer, which rotates slowly in a vertical orientation, to produce a hybrid of laminar and turbulent flow types. Rapid pulsing controls the fluid-mechanical interactions of jets and droplets with adsorbed contaminants. As a result, the chemical concentration gradient at the wafer/liquid interface is always positioned to favor desorption of contaminants. The moderate application of a pressurized solvent allows for a blend of mechanical and chemical energy for lift-off applications. Large particles are removed at the point of impact of the pulse spray due to the generation of turbulent flow. In the laminar flow regime, wherein the boundary layer is less than 1 µm, the solvent is responsible for dispersing and rinsing small particles and labile layer removal. Compared with other technologies that use fluids at super-critical pressures aided with co-solvents, dry $CO_2$/liquid approaches, and jet sprays, the rapid-pulse approach manipulates all of the essential thermal, mechanical, and chemical ingredients for effective cleaning, thereby offering a simple, elegant and cost-effective solution.

Although the above-described rapid-pulse harmonic spray method and apparatus have considerably improved efficiency of cleaning, they are still insufficiently effective for removing contaminant particles having dimensions of 0.1 µm or less.

The applicant has improved the conventional rapid-pulse harmonic spray method and device and has invented a modified cleaning system disclosed in aforementioned U.S. patent application Ser. No. 11/269,250. The apparatus disclosed in the above application is intended for cleaning flat objects such as semiconductor wafers with a pulsed liquid jet emitted from a group of nozzles that may be installed on one side or on both sides of the wafer installed in a vertically arranged rotating chuck. The cleaning chamber contains circumferentially arranged rollers that hold a semiconductor wafer in a vertical position and rotate it with a predetermined speed relative to the pair of stationary nozzle units located on both sides of the wafer. Each of the nozzle units is arranged diametrically across the wafer and contains a plurality of spray nozzles that operate in a so-called rapid-pulse harmonic spray mode. The cleaning chamber is located in a sealed enclosure with a controlled purity of the atmosphere inside the enclosure.

A mechanism that is used in a cleaning system for holding, and, if necessary, for rotating the wafers during cleaning is an important factor of the system.

In the apparatus of the aforementioned patent application, the wafer holding and driving mechanism is formed by a group of circumferentially arranged rollers, one of which is a driving roller and the remaining rollers are idler rollers. The drive roller is driven from an adjustable-speed motor. The drive roller and idler rollers are arranged in such a way that there is always a minimal radial or edge contact between the peripheries of the rollers and the periphery of the wafer and no surface contact exists along the front or backside of the wafer W during processing/cleaning. The roller holding mechanism consists of an upper vertically moveable part that holds some of the rollers and a lower stationary part that holds the remaining rollers. When it is necessary to install or remove a wafer, the upper part is moved radially outward in guides to release the wafer or to provide an access for inserting a new wafer, and then the latter is fixed in a working position by moving the upper part of the holder radially inward.

A disadvantage of the above-described wafer holding and rotating mechanism is that only one of the rollers is positively driven, while the remaining rollers are driven frictionally when they are in contact with the wafer. This causes relative sliding between the rollers and wafer and thus causes contamination of the wafer with the products of friction. Furthermore, the wafer cannot have stable rotation at high speeds, which may be required for drying. Another disadvantage of the known apparatus is that the parts that support the rollers and move in the vertical direction on the guides are located inside the cleaning chamber and also may accumulate contaminants.

US Patent Application Publication No. 2006/0096048 published in 2006 (Applicant—Katrina Mikhaylichenko, et al.) shows an embodiment of a system for supporting a wafer by three or more rollers in contact with the edge of the wafer. At least one roller can be attached to an actuator so that the roller can be moved to and away from the wafer so as to allow a wafer to be placed between the rollers by an end effector on a robot arm. Once the wafer is properly located between the rollers, the actuator can be activated to move the roller into contact with the wafer to securely hold the wafer. The actuator is shown as a linear actuator though it is mentioned that it may be an actuator of any type capable of moving the roller toward and away from the edge of the wafer. Further, the actuator can be hydraulic, pneumatic, electrical or otherwise powered to move the roller to and away from the edge of the wafer.

One or more rollers can also be coupled to a drive system that can cause the roller to rotate. In turn, the rotating roller can then cause the wafer to rotate. The remaining rollers can be bearings that both support the wafer while allowing the wafer to rotate. The wafer can be rotated within a range of between 3 to 500 rpm. A range of about 5 to about 40 rpm wafer rotation is preferable and about 20-rpm wafer rotation is most preferable in some embodiments. The desirability of a particular wafer rotation speed is determined by the particular requirements of the process as described in more detail below. The above-described device suffers from the same disadvantages as the device of U.S. patent application Ser. No. 11/269,250, i.e., only one roller is a positively driven roller while the other rollers rotate due to friction engagement with the edge of the wafer.

OBJECTS AND SUMMARY OF THE INVENTION

It is an object of the present invention to provide a compact, simple, and reliable mechanism for holding and driving semiconductor substrates, wafers, or the like arranged vertically in a wet cleaning chamber. It is another object to provide the aforementioned mechanism where all rollers that are in contact with a flat object during driving have a positive drive without sliding relative to the object's edge. It is still another object to minimize the amount of moveable parts located in a cleaning chamber and thus to minimize possibility of contamination with the products of wear and friction. It is a further object to provide a mechanism for holding and driving flat objects, wherein parts of the mechanism that project into the cleaning chamber have streamlined shapes and smooth surfaces that do not collect and accumulate contaminants that could fly away into the interior of the cleaning chamber.

The cleaning apparatus has a closed housing with a working chamber inside the housing and with a slot cut in a side wall of the housing for access to the working chamber, e.g., for insertion and removal of semiconductor wafers, or other flat objects transported by means of an end effector on the end of the mechanical hand of an industrial robot. This mechanism for holding and driving semiconductor substrates, wafers, or the like, consists of three outer shafts circumferentially spaced from each other at equal distances. Each outer shaft supports an eccentrically arranged inner shaft that supports on its distal end a profiled roller for contact with the periphery of the wafer to be treated in the chamber. Thus, the wafer is supported by the three uniformly spaced contact rollers driven into rotation. The rotation is carries out by means of a synchronous belt that is driven by a motor installed on the rear side of the housing and engaged with gear wheels secured on the proximal ends of the inner shafts. Thus, all three contact rollers are positively driven without sliding relative to the surface of the wafer. The contact rollers are made from a soft plastic material, such as polystyrene, or the like. The wafer to be treated is driven into rotation due to friction engagement with the positively driven contact rollers. The aforementioned outer shafts are used for moving the contact rollers radially outward or inward for removing the wafer from the contact rollers or for clamping a new wafer between the contact rollers. The outer shafts are provided with pins that are offset from the center of the rotation of the shafts. The pins are inserted into radial slots of three arms formed on a common hub that can be turned around the central axis of rotation of the wafer at an angle sufficient for moving the contact rollers into/from wafer opening/closing positions. The arms can be turned, e.g., by means of a linear stepper motor. In order to compensate for loosening/tensioning of the synchronous belt when the outer shafts are turned in one or the other direction together with respective gear wheels, one of the shafts is constantly urged by an expansion spring in the direction of belt tensioning. The wafer is cleaned, e.g., by a jet rapid-pulse harmonic spray device that consists, e.g., of two injection manifolds arranged on both sides of the disk in the working chamber.

BRIEF DESCRIPTION OF THE DRAWINGS

FIG. 1A is a general three-dimensional view of the rear side of the mechanism of the invention for driving contact rollers.

FIG. 1B is a view of a belt-tensioning mechanism of FIG. 1 on a larger scale.

DETAILED DESCRIPTION OF THE INVENTION

Figure 2:
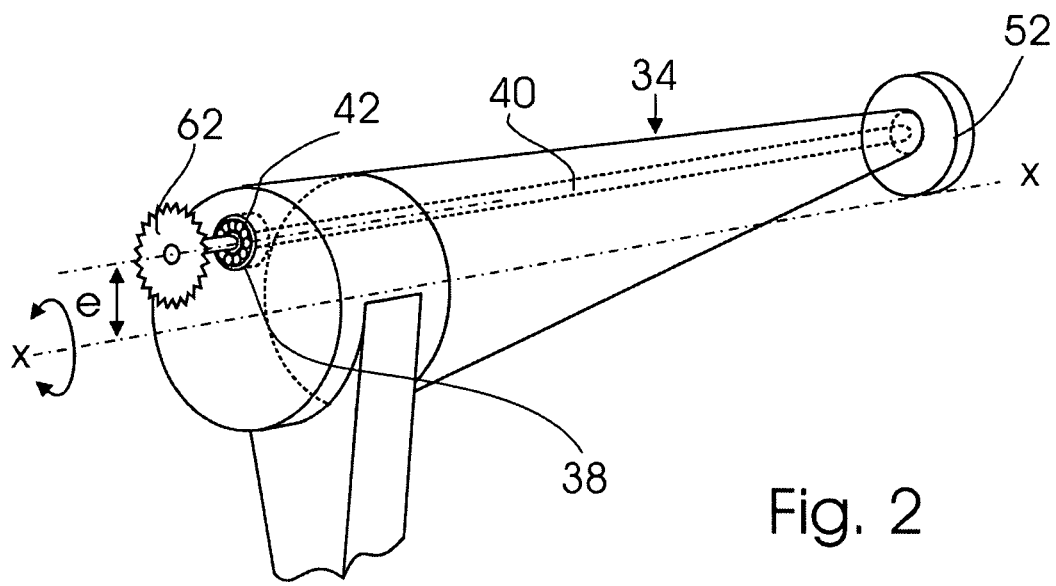
FIG. 2 is a partial three-dimensional view of devices used for rotating and offsetting a contact roller in the wafer holding and driving mechanism of the invention.

FIG. 1 is a general three-dimensional view of the rear side of the mechanism 20 of the invention for driving substrate contact rollers. The mechanism 20 is either attached to or is formed on the rear wall 21 of a cleaning chamber 22 that has a through opening 24 in its side wall 26 for insertion of a flat round object, e.g., a semiconductor wafer W into the cleaning chamber 22. The wafer W can be inserted into the cleaning chamber 22 or removed therefrom in a conventional manner, e.g., by means of an end effector on the mechanical arm of an industrial robot (not shown). The cleaning chamber 22 can be used for cleaning or for drying, depending on the conditions in the chamber and on the speed of rotation of the waver W. The system shown in FIG. 1 is intended for cleaning or drying semiconductor wafers or similar objects with vertical orientation of the latter. In particular, the system shown in FIG. 2 is intended for wet cleaning.

The mechanism 20 for holding and driving semiconductor substrates, wafers, or the like consists of three outer shafts 31, 33, and 34 circumferentially spaced from each other at equal distances. Since all of these outer shafts are identical, only one of them, e.g., the outer shaft 34, which is shown in FIG. 2 in a three-dimensional view, will be described. The outer shaft 34 is rotatingly installed in the rear wall 21 of the drive mechanism or the cleaning chamber housing. The outer shaft 34 may be installed in sliding or roller bearings, or may per se have a sliding fit in the wall 21 or the chamber housing since rotation of this shaft is not critical and is needed only for slightly moving apart the contact rollers of the wafer drive mechanism, which is described below. The front end of the outer shaft 34 projects into the cavity 29 of the cleaning chamber 22 and has a reduced diameter so that it does not occupy the useful space of the cleaning chamber. Furthermore, the parts of the outer shafts 31, 33, and 34 that project into the cleaning chamber have smooth and streamlined surfaces.

As shown in FIG. 2, the outer shaft 34 has a through opening 38 which is parallel to the axis X-X of rotation of the outer shaft 34 but is offset therefrom for a distance "e". The outer shaft 34 supports an inner shaft 40 of a smaller diameter, which is supported by ball bearings, only one of which, e.g., a ball bearing 42 is shown in FIG. 2. Thus, the inner shaft 40 is arranged eccentrically with respect to the axis X-X of rotation of the outer shaft 34. The front end of the inner shaft 34 that projects into the cleaning chamber 22 (FIG. 1) rigidly supports a contact roller 52.

Figure 3:
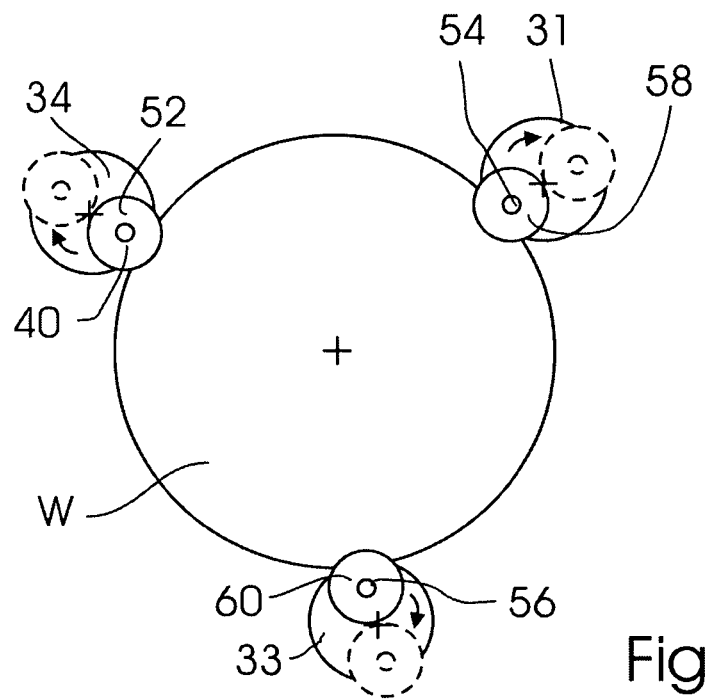
FIG. 3 is a schematic view in the direction of arrow A in FIG. 1 and illustrates positions of contact rollers relative to a wafer during wafer driving and wafer insertion/removing cycles.

FIG. 3 is a schematic view in the direction of arrow A in FIG. 1. As has been mentioned above, the outer shafts 31, 33, and 34 are identical. Therefore, two other outer shafts 31 and 33 eccentrically support appropriate inner shafts 54 and 56, which rigidly support on their front ends contact rollers 58 and 60, respectively. The rollers are arranged circumferentially at equal distances from each other and, as can be seen from FIG. 3, when a wafer W is inserted into the cleaning chamber 22 (FIG. 1) or has to be removed from the cleaning chamber 22, the contact rollers 52, 58, and 60 can be moved away from the wafer periphery.

On their rear ends, the inner shafts 40, 54, and 56 (FIG. 3) rigidly support gear wheels 62, 64, and 66, respectively, which engage an endless synchronous belt 68 that is guided over the gear wheels 62, 64, and 66 (FIG. 1). As shown in FIG. 1B, which is a view of a belt-tensioning mechanism of FIG. 1 on a larger scale, the mechanism also contains an additional gear wheel 70 which is attached to the output shaft of a rotary motor 72 and which also serves as a driving gear wheel for the synchronous belt 68 and, hence, for the gear wheels 62, 64, and 66 with their respective inner shafts 40, 54, and 56 (FIG. 3) and contact rollers 52, 58, and 60.

The device of the invention has a mechanism that constantly maintains the belt 68 in a tensioned state. For this purpose, a rear end 74 of the rotary motor 72 is guided in a slot 76 cut in the rear wall 21 of the cleaning chamber 22. The slot 76 is arranged radially with respect to the belt so that when the rear end 74 of the rotary motor 72 slides in the guide slot 76 in the direction toward the inner shafts 40, 54, and 56, the belt is tensioned. In fact, the synchronous belt 68 is constantly maintained in a stretched state, i.e., without loosening, since the additional gear wheel 70 attached to the output shaft of the motor 72 constantly urges the belt 68 in the direction of tensioning under the effect of a compression spring 78 that pulls the motor 72 in the radial outward direction of the belt 68.

The contact rollers 52, 58, and 60 may be in friction contact with the periphery of the wafer W, as shown by solid lines in FIG. 3, or, if the wafer has to be removed from the cleaning chamber 22, the contact rollers 52, 58, and 60 may be moved away from the periphery of the wafer W as shown in FIG. 3 by broken lines. This is achieved when the outer shafts 31, 33, and 34 are turned around their axis X-X (FIG. 2). Such movements toward and away from the edges of the wafer are performed by rotating the outer shafts 31, 33, and 34 by means of an eccentric-shaft-turning mechanism 82 which will now be described with reference to FIGS. 1 and 2.

Figure 4:
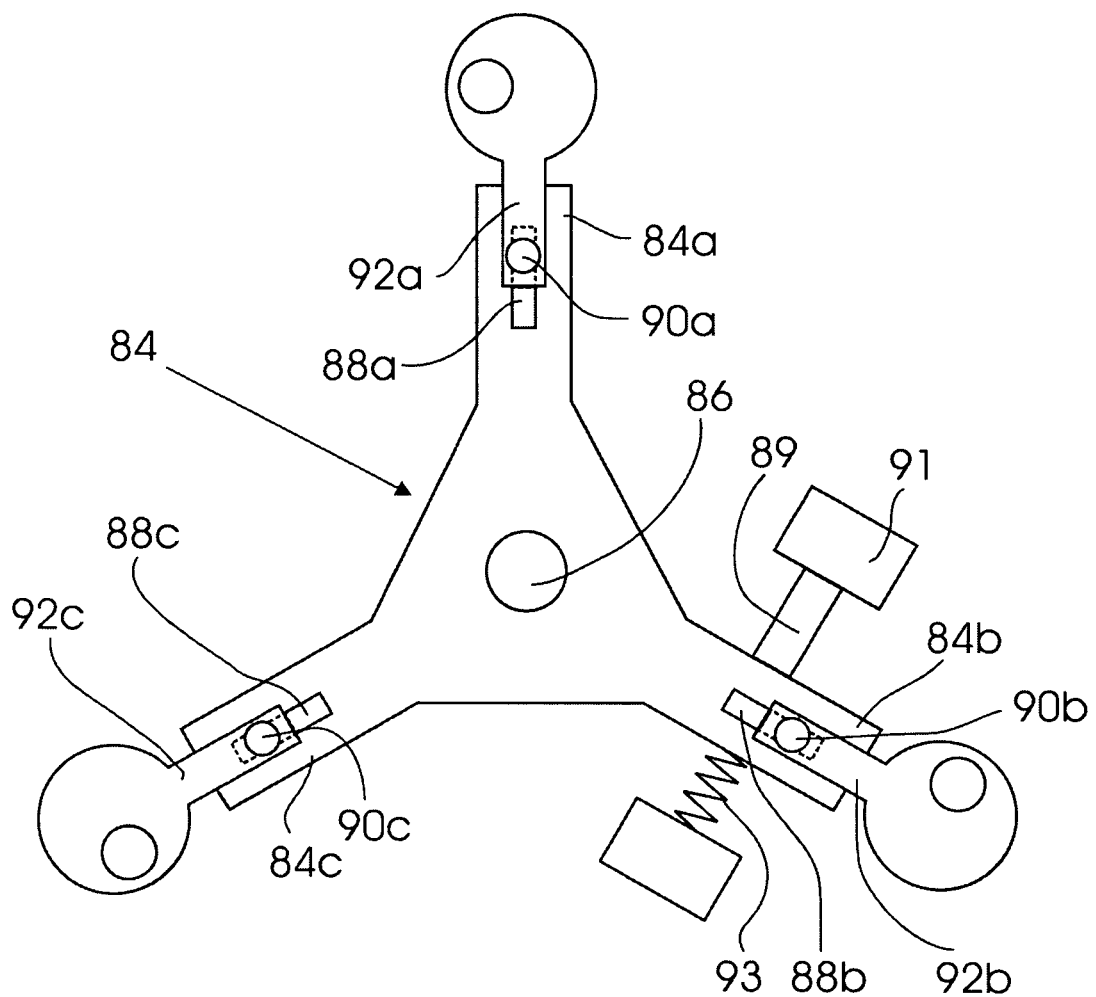
FIG. 4 is a front view of a three-armed spider mechanism of FIG. 1 on a larger scale.

In order not to overload FIG. 1 with reference numerals, the details of the eccentric-shaft-turning mechanism 82 are shown in FIG. 4. As shown in this drawing, the mechanism 82 contains a three-armed spider 84 with respective radial arms 84a, 84b, and 84c secured on the end of a shaft 86 (FIGS. 1 and 4) that is rotatingly installed in the rear wall 21 of the cleaning chamber 22 (FIG. 1). The arms 84a, 84b, and 84c have respective radial slots 88a, 88b, and 88c for slidingly guiding pins 90a, 90b, and 90c formed on the outer ends of other respective arms 92a, 92b, and 92c that project in the radial outward direction from the peripheries of the respective outer shafts 34, 31, and 33. In other words, the radial arms of the outer shafts 34, 31, and 33 and the radial arms 84a, 84b, and 84c of the three-armed spider 84 are interconnected through pin-and-slot mechanisms so that rotation of the spider 84 at an angle in one direction or in the opposite direction causes turning of the outer shafts 31, 33, and 34 around their central axes, such as axis X-X in FIG. 2, and thus causes displacement of the axes of the inner shafts, and hence, the contact rollers 52, 56, and 58 (FIG. 3) toward each other or away from each other.

The three-armed spider 84 may be turned, e.g., by pushing one of the arms, e.g., the arm 84b, in the counterclockwise direction by means of an output shaft 89 of a linear motor 91. The three-armed spider 84 can be turned to the initial position by the action of an expansion spring 93 acting in the direction opposite to the linear motor 91.

During operation, when it is necessary to insert a wafer W into a working position for cleaning in the cleaning chamber 22, the linear motor 90 (FIG. 1) extends its output shaft 89, whereby the arm 92b of the outer shaft 31 rotates in a clockwise direction against the force of the spring 93. Through interaction of pins 90a, 90b, and 90c formed on the outer ends of the respective arms 92a, 92b, and 92c with slots 88a, 88b, and 88c, the spider 84 turns the respective outer shafts 34, 31, and 33 in the clockwise direction. Since the centers of the inner shafts 40, 54, and 56 that are driven into rotation via respective gear wheels 62, 64, and 66, which engage an endless synchronous belt 68, which, in turn, is driven from the gear wheel 70 of the motor 72, the inner shafts, and hence, the contact rollers 52, 58, and 60, are moved apart and provide a space sufficient for insertion of a wafer W, e.g., by means of an end effector (not shown) through the slot 24 in the side wall 26 of the cleaning chamber 22, into the aforementioned space between the rollers. The inner shafts rotate in respective ball bearings. When the wafer W assumes the position to bring its periphery into contact with the contact rollers 52, 58, and 60, the linear motor 90 retracts its output shaft 89 and turns the three-armed spider 84 in a clockwise direction whereby the arms 90a, 90b, and 90c turn in the counterclockwise direction.

As a result, the contact rollers 52, 58, and 60 are turned toward each other until they make contact with the periphery of the wafer W. Since the inward movement of the inner shafts 40, 54, and 56 that rigidly support respective gear wheels 62, 64, and 66 loosens the synchronous belt 68, the belt is tensioned by shifting the rear end 74 of the rotary motor 72 in the guide slot 76. This is achieved by shifting the drive motor 72 in the radial outward direction of the belt 68 under the effect of the spring 78 that constantly pulls the motor 72 in the aforementioned direction.

When the wafer W is held between the contact rollers 52, 58, and 60 that frictionally engage the wafer periphery, rotation of the rollers is positively transmitted to the wafer W via friction engagement with the rollers. The speed of the motor 72 can be adjusted so that it can be rotated slowly (e.g., with the speed of 300 rpm) during wet cleaning, or it can be rotated with a higher speed, e.g., 3000 rpm, during drying. All above-described movements are synchronized and controlled by a computer (not shown), which is beyond the scope of the present invention.

Cleaning may be carried out by means of rapid-pulse harmonic spray nozzles of the type described in aforementioned U.S. patent application Ser. No. 11/269,250 of the same applicant, or by other appropriate methods where the wafer has to be rotated relative to stationary nozzles.

Thus, it has been shown that the invention provides a compact, simple, and reliable mechanism for holding and driving semiconductor substrates, wafers, or the like arranged vertically in a wet cleaning chamber.

Although the invention has been shown and described with reference to specific embodiments, it is understood that these embodiments should not be construed as limiting the areas of application of the invention and that any changes and modifications are possible, provided these changes and modifications do not depart from the scope of the attached patent claims. For example, the three-armed spider can be turned by a motor having an output shaft connected to the center of the spider. The linear motor 90 may turn the spider in the direction opposite to that described in the specification. Gears can be used for turning the outer shafts. The driving mechanism may be used not only in conjunction with the cleaning but with other processes that requires rotation of a semiconductor wafer or a similar object. The belt drive motor can be connected to any of the inner shafts instead of the shaft of the tensioning gear wheel. The gear wheel can be replaced by pulley and the synchronous belt can be replaced by a friction belt.

The invention claimed is:

1. A substrate holding and rotary driving mechanism to rotate flat round objects, the substrate holding and rotary driving mechanism comprising:
a hollow housing having a front wall, a rear wall, side walls, and an interior;
at least three outer shafts rotatingly installed in the front wall, the outer shafts having axes of rotation, front ends that extend through the front wall to the outside of the housing, and rear ends that intend into the interior;
at least three inner shafts that are rotatingly installed in the outer shafts, respectively, and have their front ends extending to the outside from the front ends of the outer shafts and their rear ends extending through the rear ends of the outer shafts, the inner shafts having axes of rotation that are eccentrically offset from the axes of rotation of the outer shafts;
rotary drive members rigidly attached to the front ends of the inner shafts;
contact members rigidly attached to the rear ends of the inner shafts;
a mechanism to turn the at least three outer shafts in one direction and in a direction opposite to the one direction to move the contact members apart to release the flat object or toward each other to come into frictional contact with the flat object due to the eccentric offset the mechanism to turn the at least three outer shafts having a spider with at least three radial arms that is rotatingly installed in the front wall of the housing and outside the housing, the at least three radial arms having linking means for linking with the at least three outer shafts for turning the outer shafts in one direction and in a direction opposite to the one direction, the mechanism to turn the at least three outer shafts further having a drive means for turning the spider; and
a mechanism to simultaneously rotate the at least three inner shafts together with the contact members to frictionally rotate the flat object when the contact members are moved toward each other, the flat object having a periphery, the contact members being contact rollers that rotate the flat object when the contact rollers are rotated by the mechanism for simultaneous rotation of the at least three inner shafts when the contact rollers come into contact with the periphery of the flat object.

2. The substrate holding and rotary driving mechanism of claim 1, wherein the linking means comprise radial slots in the at least three radial arms, projections on the outer shafts, and pins on the projections that are slidingly inserted into the radial slots so that rotation of the spider causes the contact rollers to move toward each other or to move apart from each other.

3. The substrate holding and rotary driving mechanism of claim 1, wherein the rotary drive members rigidly attached to the front ends of the inner shafts are gear wheels.

4. The substrate holding and rotary driving mechanism of claim 3, wherein the mechanism for simultaneous rotation of the at least three inner shafts is an endless synchronous belt that is guided over the gear wheels in engagement therewith and a drive motor for rotating the endless synchronous belt.

5. The substrate holding and rotary driving mechanism of claim 4, wherein the synchronous belt has a mechanism for constantly maintaining the synchronous belt in a tensioned state.

6. The substrate holding and rotary driving mechanism of claim 5, wherein the mechanism for constantly maintaining the synchronous belt in a tensioned state comprises an additional gear wheel that is engaged with the synchronous belt and a resilient member that constantly urges the additional gear in the direction of tensioning of the synchronous belt.

7. The substrate holding and rotary driving mechanism of claim 6, wherein the additional gear wheel is attached to the drive motor for rotating the endless synchronous belt and wherein the drive motor can be moved relative to the synchronous belt.

8. The substrate holding and rotary driving mechanism of claim 1, wherein the flat objects are selected from wafer substrates and semiconductor wafers, and wherein the hollow housing is a housing of a cleaning chamber for wet cleaning.

9. The substrate holding and rotary driving mechanism of claim 1, wherein the flat objects are selected from wafer substrates and semiconductor wafers, and wherein the hollow housing is a housing of a cleaning chamber for wet cleaning.

10. The substrate holding and rotary driving mechanism of claim 1, wherein the means for turning the spider comprises a linear motor that has an output shaft, the output shaft being in contact with one of the at least three radial arms for turning one of the at least three radial arms in one direction and a spring that is in contact with the one of the at least three radial arms for turning the one of the at least three radial arms into the direction opposite to the one direction.

11. The substrate holding and rotary driving mechanism of claim 1, wherein the linking means comprise radial slots in the at least three radial arms, projections on the outer shafts, and pins on the projections that are slidingly inserted into the radial slots so that rotation of the spider causes the contact rollers to move toward each other or to move apart from each other.

12. The substrate holding and rotary driving mechanism of claim 11, wherein the rotary drive members rigidly attached to the front ends of the inner shafts are gear wheels.

13. The substrate holding and rotary driving mechanism of claim 12, wherein the mechanism for simultaneous rotation of the at least three inner shafts is an endless synchronous belt that is guided over the gear wheels in engagement therewith and a drive motor for rotating the endless synchronous belt.

14. The substrate holding and rotary driving mechanism of claim 13, wherein the synchronous belt has a mechanism for constantly maintaining the synchronous belt in a tensioned state.

15. The substrate holding and rotary driving mechanism of claim 1, wherein the flat object has a vertical orientation.

16. The substrate holding and rotary driving mechanism of claim 1, wherein the flat object has a vertical orientation.

17. The substrate holding and rotary driving mechanism of claim 6, wherein the flat object has a vertical orientation.

18. A substrate holding and rotary driving mechanism to rotate flat round objects, the substrate holding and rotary driving mechanism comprising:
- a hollow housing having a front wall, a rear wall, side walls, and an interior;
- at least three outer shafts rotatingly installed in the front wall, the outer shafts having axes of rotation, front ends that extend through the front wall to the outside of the housing, and rear ends that intend into the interior;
- at least three inner shafts that are rotatingly installed in the outer shafts, respectively, and have their front ends extending to the outside from the front ends of the outer shafts and their rear ends extending through the rear ends of the outer shafts, the inner shafts having axes of rotation that are offset from the axes of rotation of the outer shafts;
- rotary drive members rigidly attached to the front ends of the inner shafts;
- contact members rigidly attached to the rear ends of the inner shafts, the contact members being contact rollers to contact and rotate the flat object on a periphery of the flat object;
- a mechanism to turn the at least three outer shafts in one direction and in a direction opposite to the one direction to move the contact members apart to release the flat object or toward each other to come into frictional contact with the flat object due to the offset, the mechanism including a spider with at least three radial arms, the spider being rotatingly installed in the front wall of the housing and outside the housing, the at least three radial arms having linking means for linking with the at least three outer shafts for turning the outer shafts in one direction and in a direction opposite to the one direction, and drive means for turning the spider; and
- a mechanism to simultaneously rotate the at least three inner shafts together with the contact members to frictionally rotate the flat object when the contact members are moved toward each other and contact the periphery of the flat object.

* * * * *

UNITED STATES PATENT AND TRADEMARK OFFICE
CERTIFICATE OF CORRECTION

PATENT NO. : 9,202,725 B2  Page 1 of 1
APPLICATION NO. : 11/490950
DATED : December 1, 2015
INVENTOR(S) : Randhawa et al.

It is certified that error appears in the above-identified patent and that said Letters Patent is hereby corrected as shown below:

On the title page item 75, in "Inventors", in column 1, line 1, after "Rubinder", delete "S.", therefor On the title page item 65, in "Prior Publication Data", in column 1, line 1, after "2008", insert item --¶Related U.S. Application Data
 (63) Related to U.S. patent application No. 11/269,250, filed on Nov. 09, 2005.--, therefor In the specification In column 5, line 31, delete "34" and insert --40--, therefor In column 6, line 44, delete "90" and insert --91--, therefor In column 6, line 62, delete "90" and insert --91--, therefor In column 7, line 36, delete "90" and insert --91--, therefor In the claims In column 8, line 5, in Claim 1, after "offset", insert --,--, therefor Signed and Sealed this
Ninth Day of August, 2016

Michelle K. Lee
*Director of the United States Patent and Trademark Office*